United States Patent
Kim et al.

(10) Patent No.: US 11,543,713 B2
(45) Date of Patent: Jan. 3, 2023

(54) DISPLAY DEVICE

(71) Applicant: Samsung Display Co., Ltd., Yongin-Si (KR)

(72) Inventors: Deok-Hwan Kim, Asan-si (KR); Jinseok Kim, Cheonan-si (KR); Hyoung-Rae Lee, Asan-si (KR); Hasook Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 81 days.

(21) Appl. No.: 16/999,296

(22) Filed: Aug. 21, 2020

(65) Prior Publication Data

US 2021/0173273 A1 Jun. 10, 2021

(30) Foreign Application Priority Data

Dec. 9, 2019 (KR) ........................ 10-2019-0162773

(51) Int. Cl.
*G02F 1/1345* (2006.01)
*G02F 1/1362* (2006.01)
*H05K 1/18* (2006.01)
*G02F 1/1335* (2006.01)

(52) U.S. Cl.
CPC .... *G02F 1/13458* (2013.01); *G02F 1/133514* (2013.01); *G02F 1/136286* (2013.01); *H05K 1/189* (2013.01); *G02F 2202/28* (2013.01); *H05K 2201/10136* (2013.01)

(58) Field of Classification Search
None
See application file for complete search history.

(56) References Cited

U.S. PATENT DOCUMENTS

| | | | |
|---|---|---|---|
| 10,254,603 B2 | 4/2019 | Kim et al. | |
| 2006/0061711 A1* | 3/2006 | Lee | G02F 1/133514 |
| | | | 349/106 |
| 2016/0143174 A1 | 5/2016 | Cho | |
| 2017/0357121 A1* | 12/2017 | Cho | G02F 1/1368 |
| 2018/0061367 A1* | 3/2018 | Ye | G09G 3/3677 |
| 2018/0173042 A1* | 6/2018 | Kim | G02F 1/1368 |
| 2019/0033645 A1* | 1/2019 | Zhang | G02F 1/133514 |
| 2020/0029439 A1* | 1/2020 | Zhang | H05K 3/321 |

FOREIGN PATENT DOCUMENTS

| | | |
|---|---|---|
| KR | 100671138 B1 | 1/2007 |
| KR | 1020080055013 A | 6/2008 |
| KR | 1020160059562 A | 5/2016 |
| KR | 1020180070783 A | 6/2018 |

* cited by examiner

*Primary Examiner* — Shan Liu
(74) *Attorney, Agent, or Firm* — Cantor Colburn LLP (57) ABSTRACT

A display device includes a first substrate including a plurality of gate lines extending in a first direction, a plurality of data lines extending in a second direction crossing the first direction, and a plurality of pixels connected to the gate lines to the data lines, a second substrate disposed on the first substrate, an image display layer disposed between the first substrate and the second substrate, a plurality of first pads which electrically connected to the gate lines, respectively, where the first pads further protrude outward than a first side surface of the first substrate, a gate driver facing the first pads, and a first adhesive disposed between the gate driver and the first pads. The first adhesive includes a first conductive film and a plurality of first conductive patterns disposed between the first conductive film and the first pads to respectively overlap the first pads.

17 Claims, 11 Drawing Sheets

DISPLAY DEVICE

This application claims priority to Korean Patent Application No. 10-2019-0162773, filed on Dec. 9, 2019, and all the benefits accruing therefrom under 35 U.S.C. § 119, the content of which in its entirety is herein incorporated by reference.

BACKGROUND

1. Field

The disclosure herein relates to a display device.

2. Description of the Related Art

In general, a display device includes a display panel including a plurality of pixels for displaying an image, a gate driver for providing gate signals to the pixels, and a data driver for providing data voltages to the pixels. The gate driver and the data driver are connected to the display panel.

The gate driver generates the gate signals to provide the generated gate signals to the pixels. The data driver generates the data voltages to provide the generated data voltages to the pixels. The pixels receive the data voltages in response to the gate signals to display an image.

An area on which the gate driver and the data driver are disposed is defined as a bezel area. To reduce the bezel area, technologies for bonding the driving units to the side surface of the display panel have been developed.

SUMMARY

The disclosure provides a display device in which signal lines and a driving unit are stably connected to each other on a side surface of the display panel.

An embodiment of the invention provides a display device includes: a first substrate including a plurality of gate lines extending in a first direction, a plurality of data lines extending in a second direction crossing the first direction, and a plurality of pixels connected to the gate lines to the data lines; a second substrate disposed on the first substrate; an image display layer disposed between the first substrate and the second substrate; a plurality of first pads which electrically connected to the gate lines, respectively, where the first pads further protrude outward than a first side surface of the first substrate; a gate driver facing the first pads; and a first adhesive disposed between the gate driver and the first pads. In such an embodiment, the first adhesive includes a first conductive film and a plurality of first conductive patterns disposed between the first conductive film and the first pads to respectively overlap the first pads.

BRIEF DESCRIPTION OF THE DRAWINGS

The above and other features of the invention will become more apparent by describing in further detail embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when one component (or region, layer, portion) is referred to as being "on", "connected to", or "coupled to" another component, it can be directly disposed/connected/coupled on/to the one component, or an intervening third component may also be present. In contrast, when an element is referred to as being "directly on", "connected directly to", or "coupled directly to" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1:
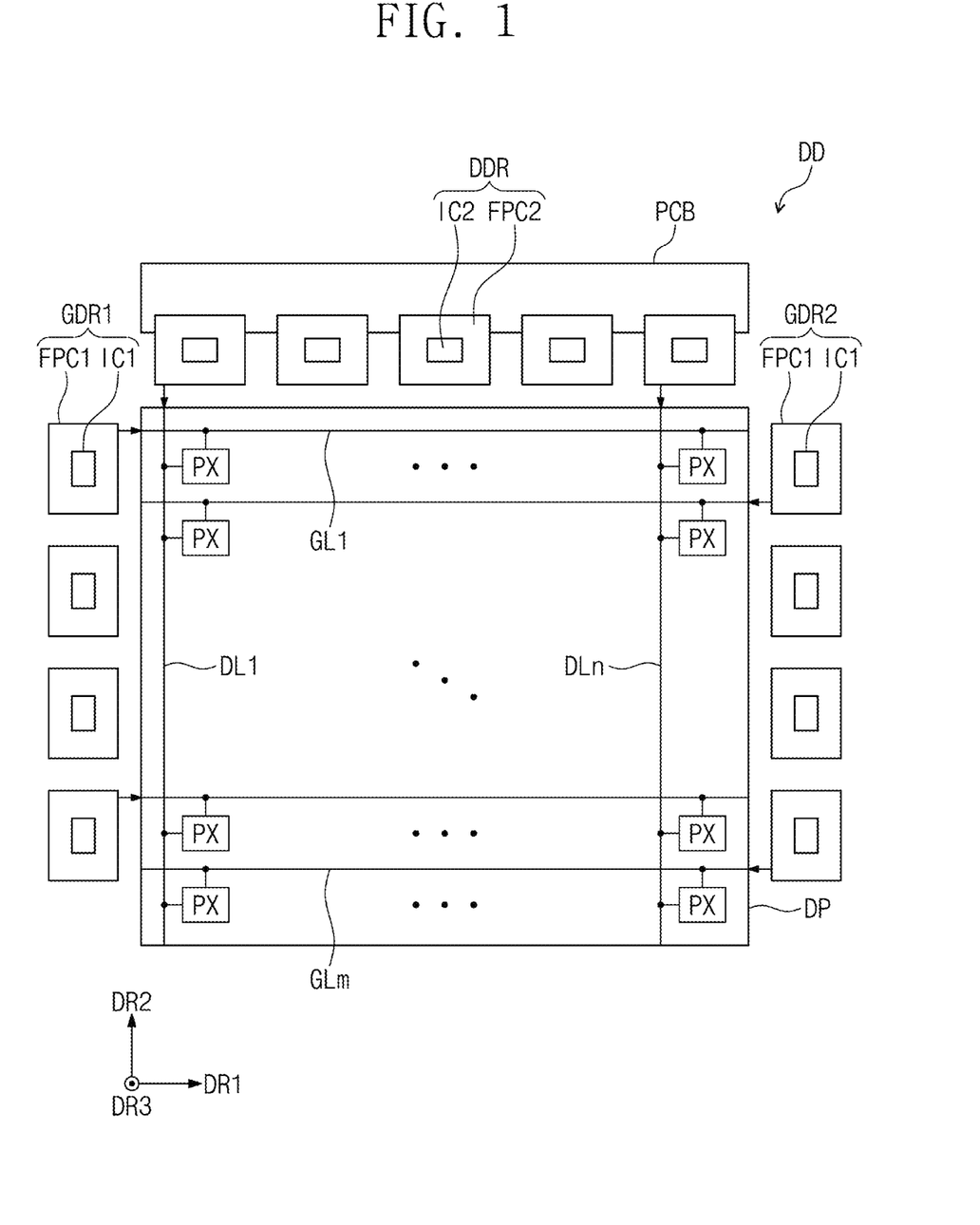
FIG. 1 is a plan view of a display device according to an embodiment of the invention.

FIG. 1 is a plan view of a display device according to an embodiment of the invention.

Referring to FIG. 1, an embodiment of a display device DD may include a display panel DP, gate drivers GDR1 and GDR2, a data driver DDR, and a printed circuit board PCB. In an embodiment, the display panel 110 may have a rectangular shape having long sides in a first direction DR1 and short sides in a second direction DR2 crossing the first direction DR1. However, the shape of the display panel DP is not limited thereto.

Hereinafter, a direction substantially perpendicularly crossing a plane defined by the first and second directions DR1 and DR2 is defined as a third direction DR3. The third direction DR3 may be a thickness direction of the display panel DP or the display device DD. Also, in this specification, the term "viewed in the plane" or "viewed in a plan view" may mean a state viewed in the third direction D3.

The display panel DP may be a liquid crystal display panel including a liquid crystal layer. However, the embodiment of the invention is not limited thereto. In one alternative embodiment, for example, the display panel DP may be an electrophoretic display panel including an electrophoretic layer or an electrowetting display panel including an electrowetting layer. The liquid crystal layer, the electrophoretic layer, and the electrowetting layer may be defined as an image display layer.

The display panel DP may include a plurality of pixels PX, a plurality of gate lines GL1 to GLm, and a plurality of data lines DL1 to DLn. Here, m and n are natural numbers. The gate lines GL1 to GLm and the data lines DL1 to DLn may be insulated from each other and extend to cross each other.

The pixels PX may be connected to the gate lines GL1 to GLm and the data lines DL1 to DLn. Each of the pixels PX may display one of primary colors. The primary colors may include red, green, blue, and white colors. However, an embodiment of the invention is not limited thereto. In one alternative embodiment, for example, the primary colors may further include various colors such as a yellow color, cyan, and magenta.

The gate lines GL1 to GLm may extend in the first direction DR1, and the data lines DL1 to DLn may extend in the second direction DR2. The gate drivers GDR1 and GDR2 may be connected to the display panel DP to be connected to the gate lines GL1 to GLm. The data driver DDR may be connected to the display panel DP to be connected to the data lines DL1 to DLn.

The gate drivers GDR1 and GDR2 and the data driver DDR are illustrated to be separated from the display panel DP for convenience of illustration to illustrate a plan view of the gate drivers GDR1 and GDR2 and the data driver DDR. The configuration in which the gate drivers GDR1 and GDR2 and the data driver DDR are connected to the display panel DP will be described in detail below.

The gate drivers GDR1 and GDR2 may include a first gate driver GDR1 and a second gate driver GDR2, which are respectively adjacent to opposing sides of the display panel DP in the first direction DR1. The first and second gate drivers GDR1 and GDR2 may be adjacent to the short sides of the display panel DP, respectively.

The first gate driver GDR1 may be connected to odd-numbered gate lines among the gate lines GL1 to GLm. The second gate driver GDR2 may be connected to even-numbered gate lines among the gate lines GL1 to GLm.

In one embodiment, for example, the gate drivers includes two gate drivers GDR1 and GDR2 as illustrated in FIG. 1, but are not limited thereto. In an alternative embodiment, a single gate driver may be disposed on one side of the display panel DP and connected to the gate lines GL1 to GLm.

Each of the first and second gate drivers GDR1 and GDR2 includes a first flexible circuit boards FPC1 and a plurality of first driving chips IC1, which are mounted on the first flexible circuit boards FPC1, respectively. The first driving chips IC1 may be connected to the display panel DP through the first flexible circuit boards FPC1.

The first driving chips IC1 of the first gate driver GDR1 may be connected to odd-numbered gate lines through the first flexible circuit boards FPC1 of the first gate driver GDR1. The first driving chips IC1 of the second gate driver GDR2 may be connected to even-numbered gate lines through the first flexible circuit boards FPC1 of the second gate driver GDR2.

In one embodiment, for example, each of the first and second gate drivers GDR1 and GDR2 may include four first driving chips IC1 and four first flexible circuit boards FPC1, as illustrated in FIG. 1. However, the number of each of the first driving chips IC1 and the first flexible circuit boards FPC1 are not limited thereto, but may be variously modified based on the size of the display panel DP.

The data driver DDR may be adjacent to one side of opposing sides of the display panel DP in the second direction DR2. The data driver DDR may be adjacent to one long side of the long sides of the display panel DP.

The data driver DDR may include a plurality of second flexible circuit boards FPC2 and a plurality of second driving chips IC2, which are mounted on the second flexible circuit boards FPC2, respectively. The second driving chips IC2 may be connected to the display panel DP through the second flexible circuit boards FPC2.

In one embodiment, for example, the data driver DDR may include five second driving chips IC2 and five second flexible circuit boards FPC2 as illustrated in FIG. 1. However, the number of each of the second driving chips IC2 and the second flexible circuit boards FPC2 are not limited thereto, but may be variously modified based on the size of the display panel DP.

The second flexible circuit boards FPC2 may be connected to the printed circuit board PCB. The second driving chips IC2 may be connected to the printed circuit board PCB through the second flexible circuit boards FPC2.

A timing controller (not shown) may be disposed on the printed circuit board PCB. The timing controller may be mounted on the printed circuit board PCB in the form of an integrated circuit chip. The timing controller may be connected to the first and second gate drivers GDR1 and GDR2 and the data driver DDR. The timing controller may output a gate control signal, a data control signal, and image data.

Each of the first and second gate drivers GDR1 and GDR2 may receive a gate control signal from the timing controller and generate a plurality of gate signals in response to the gate control signal. The gate signals may be sequentially output from the first and second gate drivers GDR1 and GDR2. The gate signals may be provided to the pixels PX through the gate lines GL1 to GLm.

The data driver DDR may receive the image data and the data control signal from the timing controller. The data driver DDR may generate and output analog type data voltages corresponding to the image data in response to the data control signal. The data voltages may be provided to the pixels PX through the data lines DL1 to DLn.

The pixels PX may receive the data voltages through the data lines DL1 to DLn in response to the gate signals received through the gate lines GL1 to GLm. The pixels PX may display gray scales corresponding to the data voltages. As a result, an image may be displayed.

Figure 2:
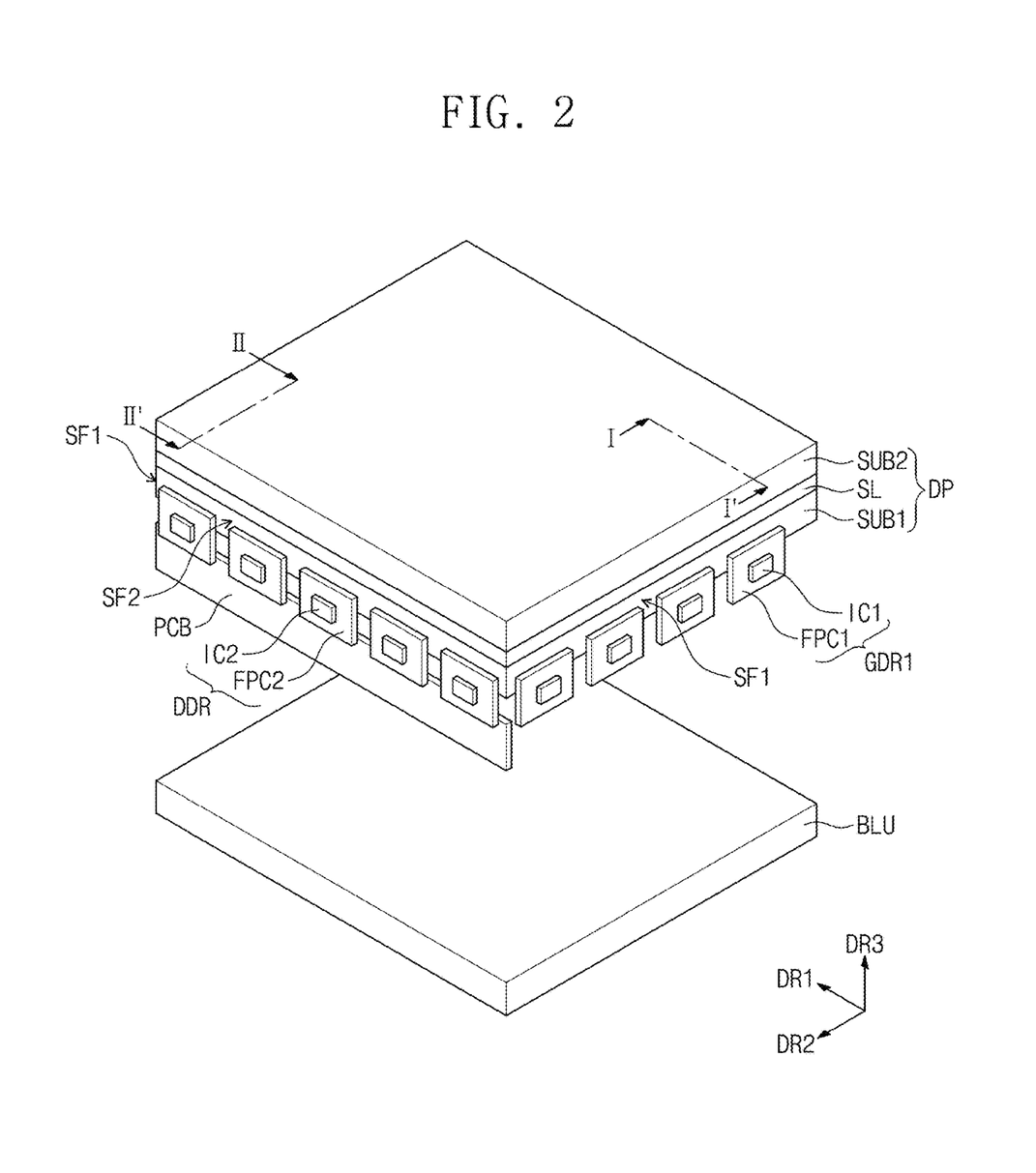
FIG. 2 is an exploded perspective view of the display device of FIG. 1.

FIG. 2 is an exploded perspective view of the display device of FIG. 1.

Referring to FIG. 2, an embodiment of the display panel DP may include a first substrate SUB1, a second substrate SUB2, and an encapsulation layer SL disposed between the first and second substrates SUB1 and SUB2. Each of the first substrate SUB1 and the second substrate SUB2 may have a rectangular shape having long sides extending in the first direction DR1 and short sides extending in the second direction DR2. The encapsulation layer SL may extend along an edge of each of the first substrate SUB1 and the second substrate SUB2 to bond the first substrate SUB1 and the second substrate SUB2.

The display device DD may include a backlight unit BLU disposed below the display panel DP. The backlight unit BLU may generate light to provide the light to the display panel DP. The pixels PX of the display panel DP may display an image by using the light received from the backlight unit BLU.

The first and second gate drivers GDR1 and GDR2 may be disposed on the side surface of the display panel DP. In one embodiment, for example, the first and second gate drivers GDR1 and GDR2 may be disposed on opposing side surfaces of the first substrate SUB1 in the first direction DR1. Although FIG. 1 shows the first gate driver GDR1 disposed on one side surface of the first substrate SUB1, the second gate driver GDR2 may also be disposed on the opposite side surface of the first substrate SUB1.

Hereinafter, opposing side surfaces of the first substrate SUB1, on which the first and second gate drivers GDR1 and GDR2 are disposed, are defined as first side surfaces SF1. The first side surfaces SF1 may be defined by short side surfaces of the first substrate SUB1. The first side surfaces SF1 may extend in the second direction DR2.

The data driver DDR may be disposed on another side surface of the display panel DP. In one embodiment, for example, the data driver DDR may be disposed on one of opposing side surfaces of the first substrate SUB1 in the second direction DR2. Hereinafter, the one side surface of the first substrate SUB1, on which the data driver DDR is disposed, is defined as a second side surface SF2. The second side surface SF2 may be defined by one long side surface of the first substrate SUB1. The second side surface SF2 may extend in the first direction DR1.

The first and second gate drivers GDR1 and GDR2 may be connected to the first side surfaces SF1. The data driver DDR may be connected to the second side surface SF2. Hereinafter, the above-described constitutions will be described in detail.

Figure 3:
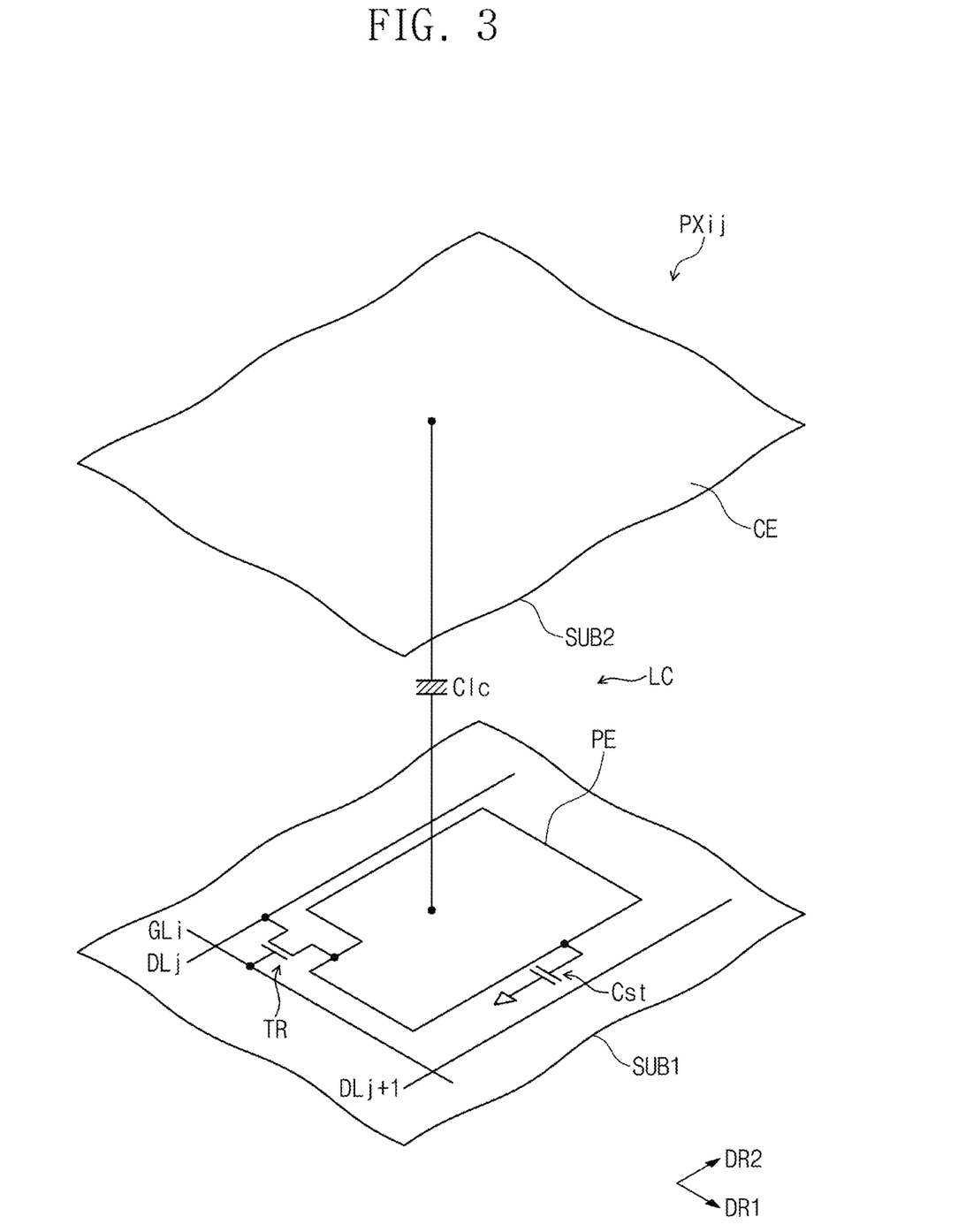
FIG. 3 is a view illustrating a configuration of a pixel of FIG. 1.

FIG. 3 is a view illustrating a configuration of a pixel of FIG. 1.

For convenience of description, a pixel PXij connected to a gate line GLi and a data line DLj is illustrated in FIG. 3, and other pixels PX of the display panel 110 may have a same configuration as the pixel PXij of FIG. 3.

Referring to FIG. 3, in an embodiment, the first substrate SUB1 may include a gate line GLi, a data line DLj, and a pixel PXij connected to the gate line GLi and the data line DLj. In such an embodiment, the pixel PXij may include a transistor TR connected to the gate line GLi and the data line DLj, a liquid crystal capacitor Clc connected to the transistor TR, and a storage capacitor Cst parallelly connected to the liquid crystal capacitor Clc. Alternatively, the storage capacitor Cst may be omitted. Here, i and j are natural numbers.

The transistor TR may include a gate electrode (not shown) connected to the gate line GLi, a source electrode (not shown) connected to the data line DLj, and a drain electrode (not shown) connected to the liquid crystal capacitor Clc and the storage capacitor Cst.

The liquid crystal capacitor Clc may include a pixel electrode PE disposed on the first substrate SUB1 and connected to the transistor TR, a common electrode CE disposed on the second substrate SUB2, and the liquid crystal layer LC disposed between the pixel electrode PE and the common electrode CE. The liquid crystal layer LC may serve as a dielectric.

Although the pixel electrode PE has a non-slit structure in FIG. 3, the embodiment of the invention is not limited thereto. For example, the pixel electrode PE may have a slit structure including a stem part having a cross shape and a plurality of branch parts radially extending from the stem part. The common electrode CE may be disposed on an entire surface of the second substrate SUB2.

The storage capacitor Cst may include the pixel electrode PE, a storage electrode (not shown) that is branched from a storage line (not shown), and an insulation layer disposed between the pixel electrode PE and the storage electrode. The storage line may be disposed on the first substrate SUB1. In an embodiment, the storage line and the gate lines GL1 to GLm may be formed on a same layer during a same process. The storage electrode may partially overlap the pixel electrode PE.

The pixel PXij may further include a color filter CF (shown in FIG. 4) that represents one of red, green, and blue colors.

The transistor TR may be turned on in response to the gate signal provided through the gate line GLi. A data voltage received through the data line DLj may be provided to the pixel electrode PE of the liquid crystal capacitor Clc through the transistor TR that is turned on. A common voltage may be applied to the common electrode CE.

Electric fields may be generated between the pixel electrode PE and the common electrode CE by a difference in voltage level between the data voltage and the common voltage. Liquid crystal molecules of the liquid crystal layer LC may operate by the electric fields generated between the pixel electrode PE and the common electrode CE. Light transmittance may be adjusted by the liquid crystal molecules that operate by the electric field to display an image.

A storage voltage having a constant voltage level may be applied to the storage line. However, the embodiment of the invention is not limited thereto. In one embodiment, for example, the common voltage may be applied to the storage line. The storage capacitor Cst may serve to compensate a charged amount of liquid crystal capacitor Clc.

Figure 4:
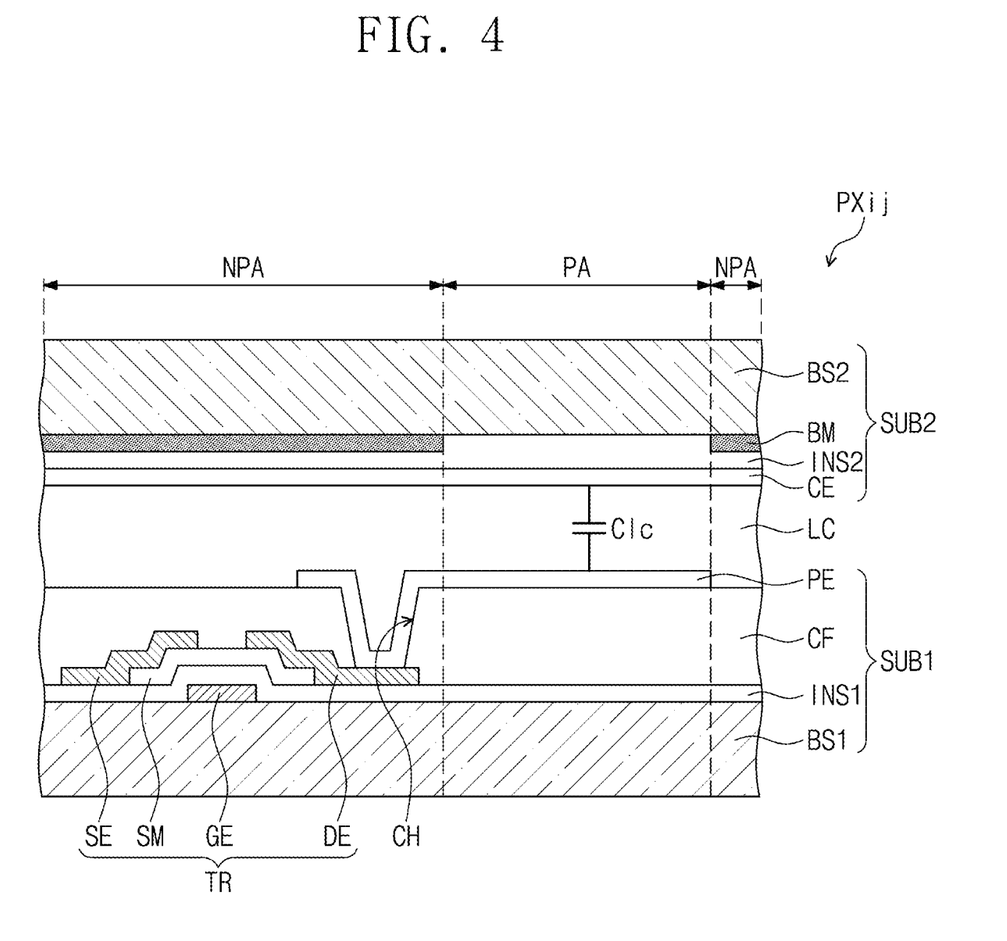
FIG. 4 is a schematic cross-sectional view of the pixel of FIG. 3.

FIG. 4 is a schematic cross-sectional view of the pixel of FIG. 3.

For convenience of illustration and description, the storage capacitor Cst illustrated in FIG. 3 is omitted in FIG. 4.

Referring to FIG. 4, the first substrate SUB1 may include a first base substrate BS1, a transistor TR, a color filter CF, and a pixel electrode PE. An area of the pixel PXij on the plane may include a pixel area PA and a non-pixel area NPA around the pixel area PA. The transistor TR may be disposed on the non-pixel area NPA, and the pixel electrode PE may overlap the pixel area PA.

The first base substrate BS1 may be a transparent or opaque insulation substrate. In one embodiment, for example, the first base substrate BS1 may include a silicon substrate, a glass substrate, or a plastic substrate.

The gate electrode GE of the transistor TR may be disposed on the first base substrate BS1. In an embodiment, the gate electrode GE may be defined by a portion branched from the gate line GLi. A first insulation layer INS1 may be disposed on the first base substrate BS1 to cover the gate electrode GE. The first insulation layer INS1 may be defined as a gate insulation layer. The first insulation layer INS1 may be an inorganic insulation layer including or formed of an inorganic material.

A semiconductor layer SM of the transistor TR may be disposed on the first insulation layer INS1 covering the gate electrode GE. Although not shown, the semiconductor layer SM may include an active layer and an ohmic contact layer.

The source electrode SE and the drain electrode DE of the transistor TR may be spaced apart from each other on the semiconductor layer SM and the first insulation layer INS1. The semiconductor layer SM may provide a conductive channel between the source electrode SE and the drain electrode DE.

The color filter CF may be disposed on the first insulation layer INS1 to cover the source electrode SE and the drain electrode DE. In an embodiment, the source electrode SE may be defined by a portion branched from the data line DLj.

Although not shown, a passivation layer may be disposed on the first insulation layer INS1 to cover the source electrode SE and the drain electrode DE. The passivation layer may be an inorganic insulation layer including or containing an inorganic material. The color filter CF may be disposed on the passivation layer. A contact hole CH, through which a predetermined area of the drain electrode DE is exposed, may be defined in the color filter CF.

The pixel electrode PE may be disposed on the color filter CF on the pixel area PA. The pixel electrode PE may extend to the non-pixel area NPA and be electrically connected to the drain electrode DE through the contact hole CH.

A liquid crystal layer LC may be disposed between the first substrate SUB1 and the second substrate SUB2. The second substrate SUB2 may include a second base substrate BS2, a black matrix BM, a second insulation layer INS2, and a common electrode CE. The second base substrate BS2 may include a same material as the first base substrate BS1.

The black matrix BM may be disposed below the second base substrate BS2 on the non-pixel area NPA. The second insulation layer INS2 may be disposed under the second base substrate BS2 to cover the black matrix BM. The common electrode CE may be disposed below the second insulation layer INS2.

The liquid crystal capacitor Clc may include a pixel electrode PE, a common electrode CE facing the pixel electrode PE, and a liquid crystal layer LC between the pixel electrode PE and the common electrode CE.

Figure 5:
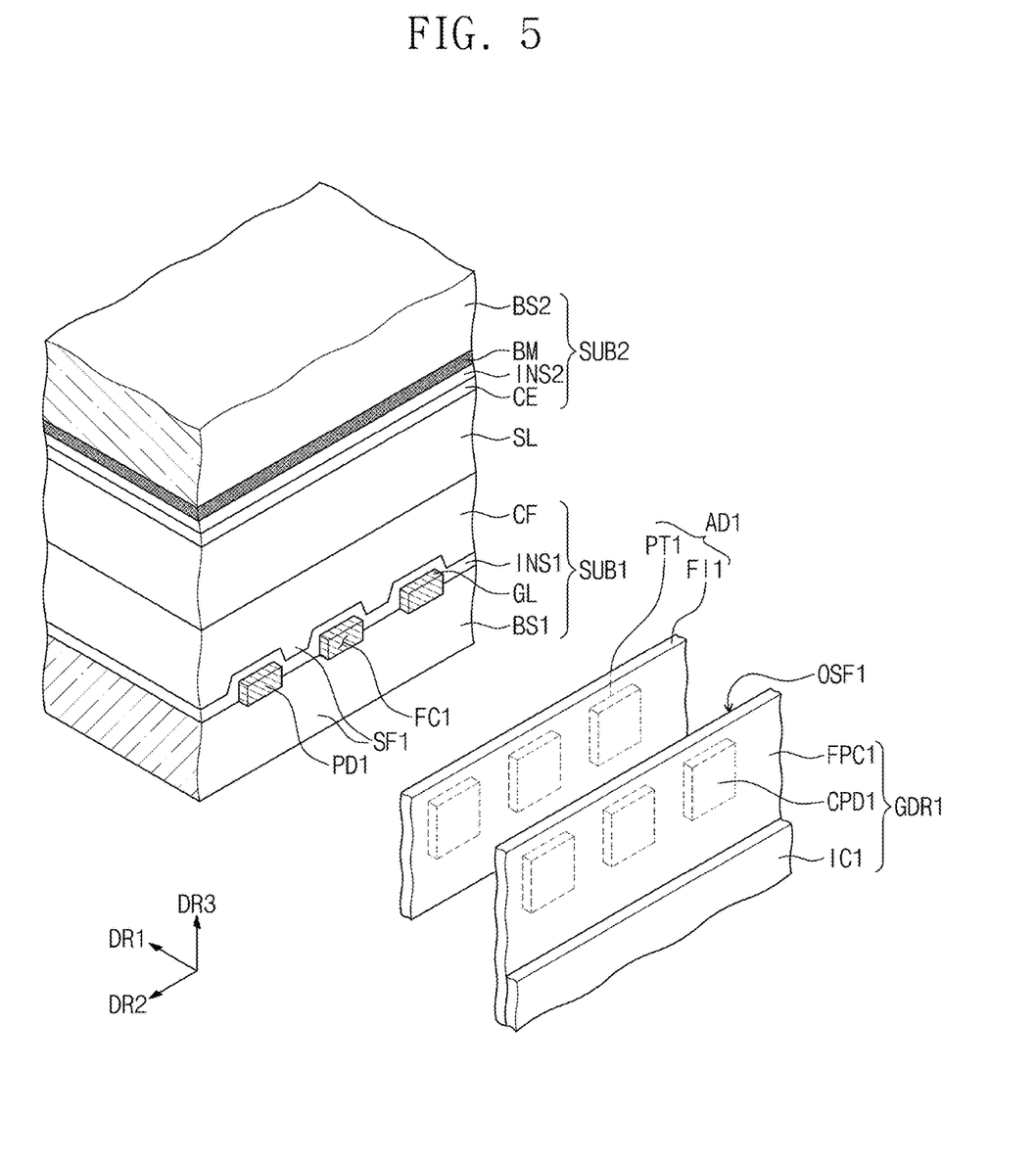
FIG. 5 is a view illustrating a portion of a first side surface on which a first gate driver of FIG. 2 is disposed.
Figure 6:
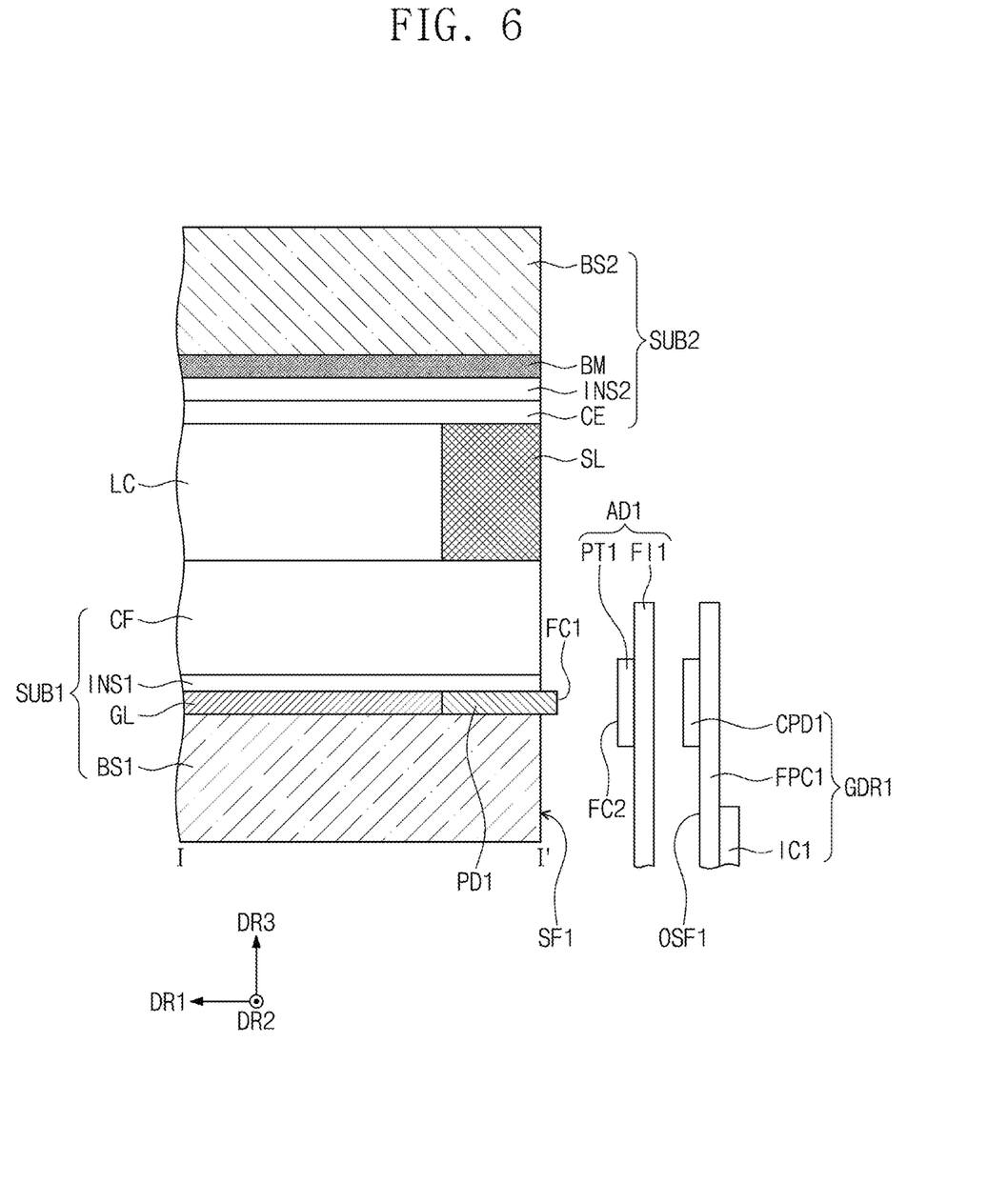
FIG. 6 is a cross-sectional view of FIG. 5 when viewed in a second direction.

FIG. 5 is a view illustrating a portion of a first side surface on which the first gate driver of FIG. 2 is disposed. FIG. 6 is a cross-sectional view of FIG. 5 when viewed in the second direction. For convenience of description, FIGS. 5 and 6 illustrate a state in which the display panel DP, a first adhesive AD1, and the first gate driver GDR1 are separated from each other.

Referring to FIGS. 5 and 6, in an embodiment of a display device, each of the gate lines GL may be connected to the plurality of first pads PD1. In one embodiment, for example, each of the first pads PD1 may be defined by a portion extending from the corresponding gate line GL. The first pads PD1 may include a conductive material. However, such an embodiment is not limited thereto. In an alternative embodiment, the first pads PD1 and the gate lines GL may be separately provided to be connected to each other.

The first pad PD1 may have a same thickness as the gate line GL in the third direction DR3. When viewed in the first direction DR1, a first surface FC1 of the first pad PD1 may have a surface area larger than that of a cross-sectional surface of the gate line GL.

The first pads PD1 may further protrude outside than the first side surface SF1 of the first substrate SUB1. Here, the first side surface SF1 of the first substrate SUB1 may be defined as side surfaces of the first base substrate BS1 and the color filter CF. In an embodiment, the first pads PD1 may protrude from the first side surface SF1 in the first direction DR1. The first pads PD1 may be spaced apart from each other in the second direction DR2. In FIG. 5, for convenience of illustration, only three first pads PD1 spaced apart from each other in the second direction DR2 are illustrated, but not being limited thereto. In such an embodiment, the number of the first pads PD1 may be greater than three.

Although not shown, the first pads PD1 may be disposed to protrude from the side surface of the first substrate SUB1 even on the opposite side of the display panel DP.

The first flexible circuit board FPC1 of the first gate driver GDR1 may be disposed to face the first side surface SF1. The first flexible circuit board FPC1 may extend in the second direction DR2. The first gate driver GDR1 may include a plurality of first connection pads CPD1 disposed on a surface OSF1 of the first flexible circuit board FPC1 facing the first side surface SF1. The first connection pads CPD1 may include a conductive material.

When viewed in the first direction DR1, the first connection pad CPD1 may have a rectangular shape. The first connection pads CPD1 may be spaced apart from each other in the second direction DR2. The first connection pads CPD1 may overlap the first pads PD1 in the first direction DR1. A surface facing the first pad PD1 on the first connection pad CPD1 may have a surface area greater than that of the first surface FC1 of the first pad PD1. The first driving chip IC1 may be disposed on an opposite surface of the surface OSF1 of the first flexible circuit board FPC1 facing the first side surface SF1.

A first adhesive AD1 may be disposed between the first pads PD1 and the first gate driver GDR1. The first adhesive AD1 may allow the first gate driver GDR1 to adhere to the first side surface SF1 of the first substrate SUB1. The first adhesive AD1 may electrically connect the first pads PD1 protruding from the first side surface SF1 of the first substrate SUB1 to the first connection pads CPD1 of the first gate driver GDR1 corresponding to the first pads PD1. Thus, the gate lines GL may be electrically connected to the first driving chip IC1. The first adhesive AD1 may include first conductive patterns PT1 and a first conductive film FI1. The first adhesive AD1 will hereinafter be described in detail.

Figure 7:
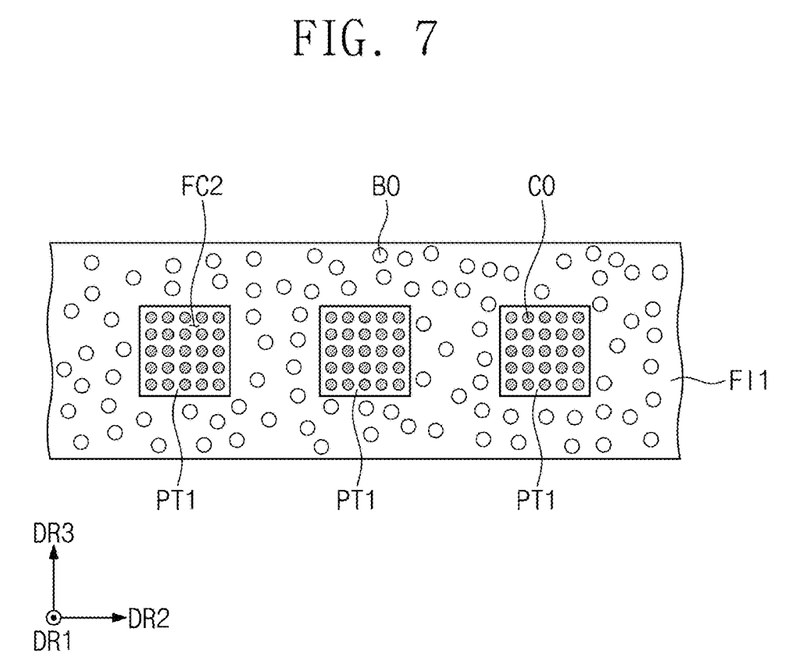
FIG. 7 is a front view illustrating a first adhesive of FIG. 5 when viewed in the first direction.
Figure 8:
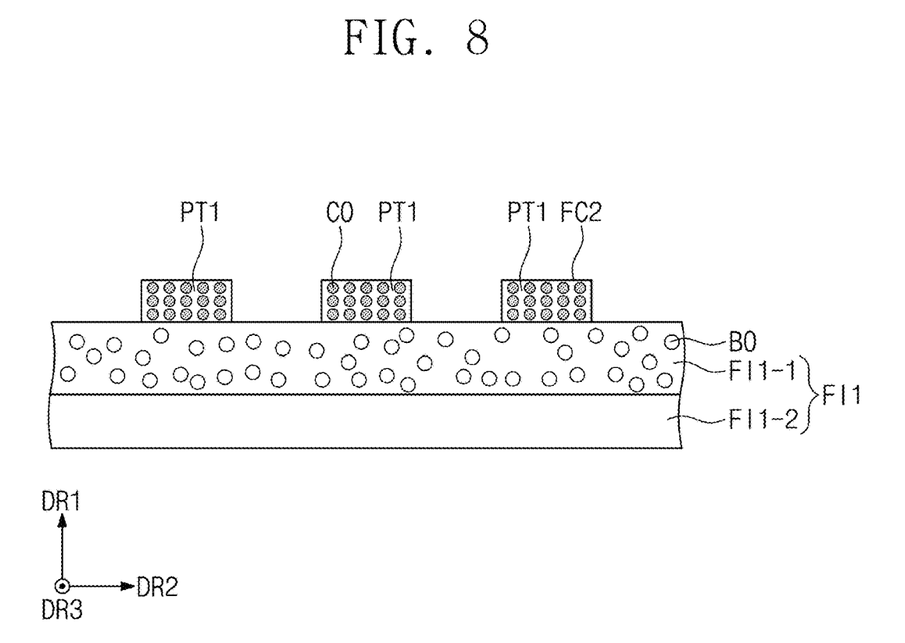
FIG. 8 is a plan view illustrating the first adhesive of FIG. 5 when viewed in a third direction.

FIG. 7 is a front view illustrating a first adhesive of FIG. 5 when viewed in the first direction, and FIG. 8 is a plan view illustrating the first adhesive of FIG. 5 when viewed in a third direction.

Referring to FIGS. 7 and 8, an embodiment of the first conductive film FI1 may be an anisotropic conductive film ("ACF"). The first conductive film FI1 may extend in the second direction DR2. The first conductive film FI1 may have a structure in which a plurality of films are laminated. In one embodiment, for example, the first conductive film FI1 may include a first film FI1-1 and a second film FI1-2 containing a material different from that of the first film FI1-1. The first film FI1-1 may be disposed on the second film FI1-2. Each of the first film FI1-1 and the second film FI1-2 may include an insulation material.

The first conductive film FI1 may include a plurality of conductive balls BO. Each of the conductive balls BO may include a conductive material. The conductive balls BO may be arranged inside the first film FI1-1. The conductive balls BO may be randomly arranged inside the first film FI1-1. The adjacent conductive balls BO may be insulated from each other by the first film FI1-1.

The conductive balls BO may have fluidity. In one embodiment, for example, the conductive balls BO arranged inside the first film FI1-1 may move inside the first film FI1-1 and the second film FI1-2 by heat and a pressure, which are applied from the outside. This will be described later in detail.

However, the first conductive film FI1 is not limited to those as described above. The first conductive film FI1 may be implemented as a single film including conductive balls. Alternatively, the first conductive film FI1 may be implemented by laminating more than two films.

The first conductive patterns PT1 may be disposed on the first conductive film FI1. The first conductive patterns PT1 may protrude from a surface of the first conductive film FI1. Each of second surfaces FC2 of the first conductive patterns PT1 may have a rectangular shape. Each of the second surfaces FC2 of the first conductive patterns PT1 may have a surface area greater than that of each of the first surfaces FC1 of the first pads PD1.

The first conductive patterns PT1 may include a plurality of conductive particles CO. In one embodiment, for example, the conductive particles CO may include silver (Ag). Silver (Ag) is known as a metal material having high electrical conductivity among various metal materials. However, the material of the conductive particles CO is not limited thereto and may include at least one material selected from other conductive materials.

The first conductive patterns PT1 may be spaced apart from each other in the second direction DR2. The first conductive patterns PT1 may be electrically insulated from each other. The first conductive patterns PT1 may overlap the first pads PD1 and the first connection pads CPD1 (see FIG. 5).

The first conductive patterns PT1 may be formed by various methods. In one embodiment, for example, the first conductive patterns PT1 may be formed by applying paste including silver (Ag) after a mask, on which a shape corresponding to the first conductive patterns PT1 is patterned, is disposed on the first conductive film FI1. Alternatively, the first conductive patterns PT1 may be formed by forming an Ag layer on a surface of the first conductive film FI1 and patterning the Ag layer by using a laser device. However, the method of forming the first conductive patterns PT1 is not limited to the above-described methods. The first conductive patterns PT1 may be formed by another method.

Figure 9:
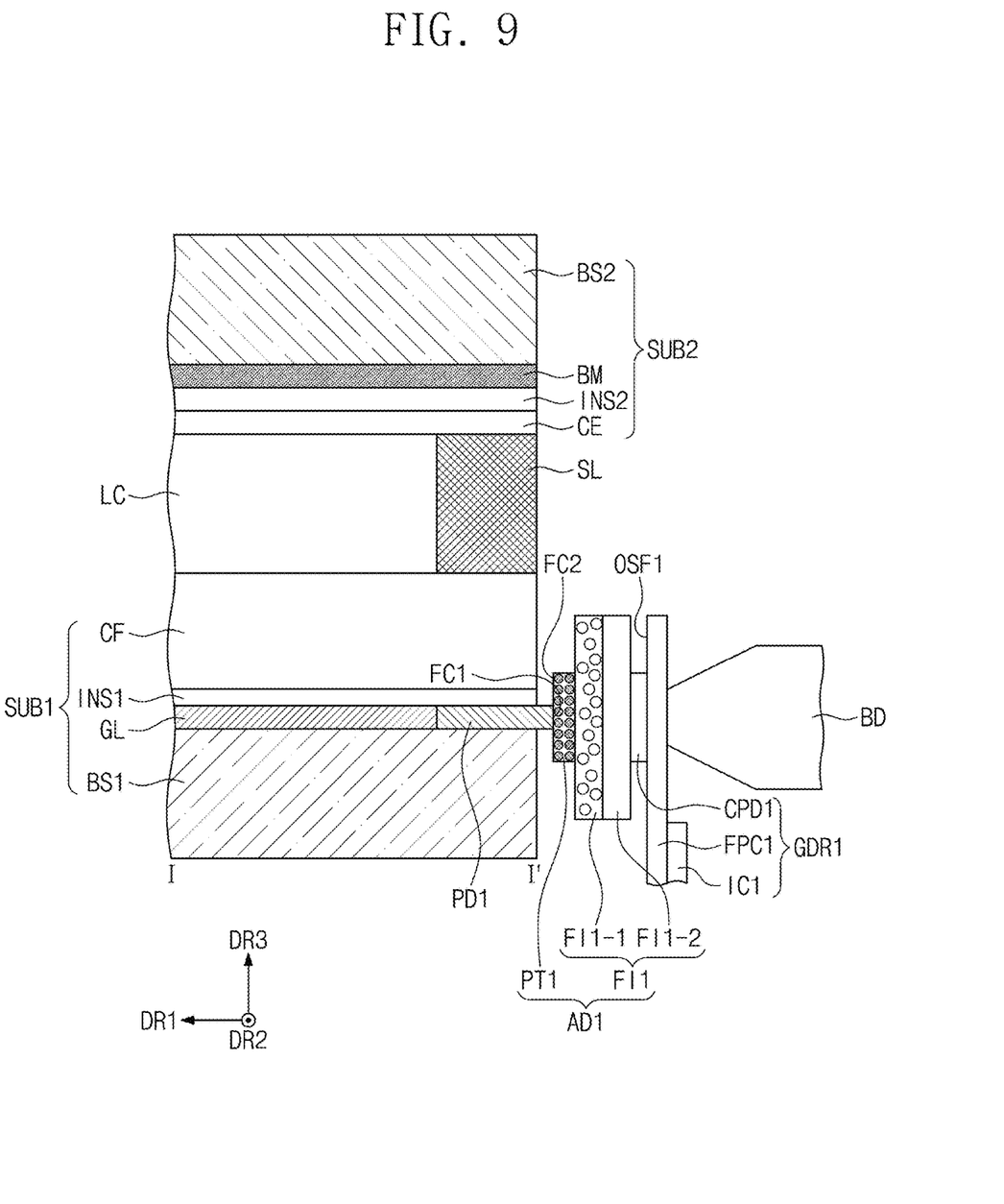
FIG. 9 is a view illustrating an embodiment of a process of bonding the first gate driver to a display panel DP.

FIG. 9 is a view illustrating an embodiment of a process of bonding the first gate driver GDR1 to a display panel DP.

Figure 10:
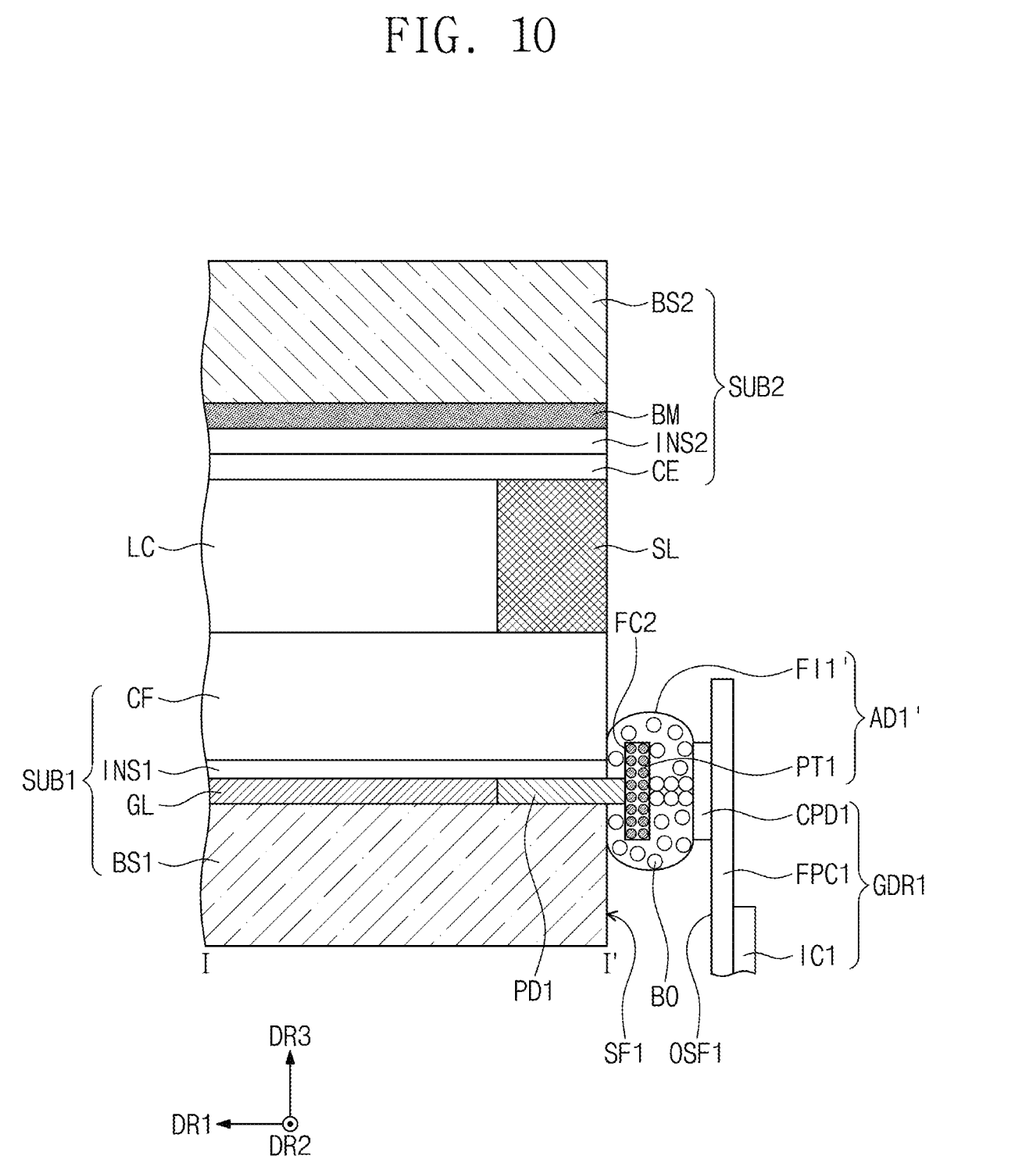
FIG. 10 is a cross-sectional view taken along line I-I' of FIG. 2.

FIG. 10 is a cross-sectional view taken along line I-I' of FIG. 2.

Figure 11:
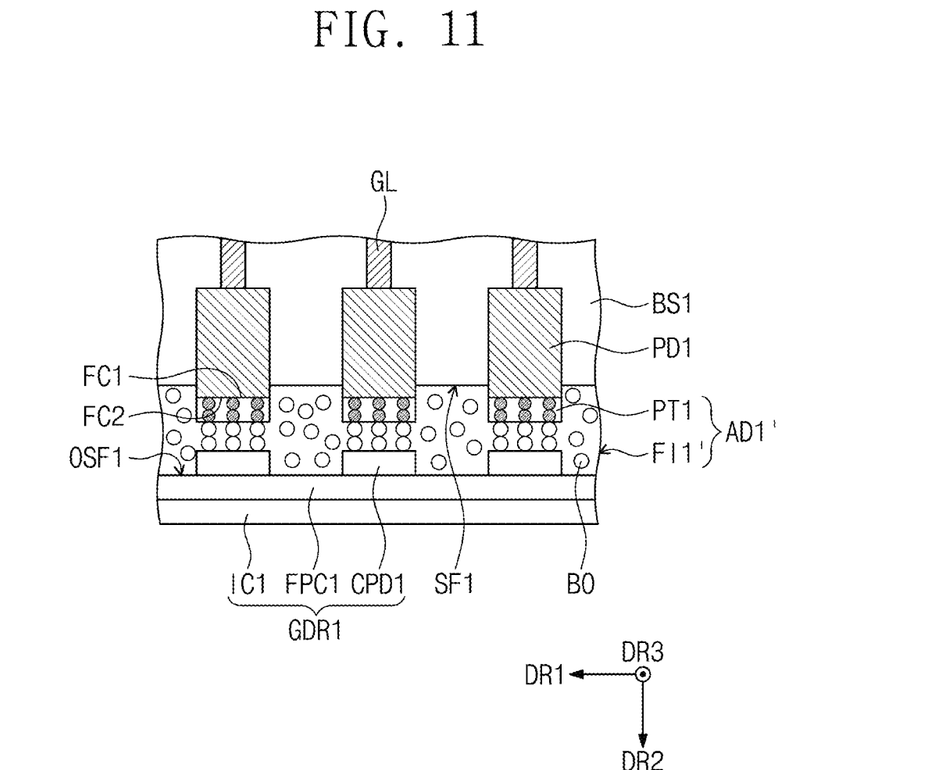
FIG. 11 is a plan view illustrating a connection state between first pads and the first gate driver of FIG. 10 when viewed in a third direction.

FIG. 11 is a plan view illustrating a connection state between first pads and the first gate driver of FIG. 10 when viewed in a third direction. For convenience of illustration and description, constituents disposed on the gate lines are omitted in FIG. 11.

Referring to FIG. 9, the first adhesive AD1 may be disposed between the first pads PD1 and the first gate driver GDR1. The first pads PD1, the first conductive patterns PT1, and the first connection pads CPD1 may be arranged to overlap each other in the first direction DR1.

The first surfaces FC1 of the first pads PD1 may face the second surfaces of the first conductive patterns. The first surfaces FC1 may contact the second surfaces FC2 of the first conductive patterns PT1, respectively. The first surfaces FC1 may contact the second surfaces FC2 of the first conductive pattern PT1 of the first adhesive AD1. Since the surface area of the second surface FC2 of the first conductive pattern PT1 is larger than that of the first surface FC1 of the first pads PD1, a contact surface between the first pad PD1 and the first conductive pattern PT1 may be the same as the surface area of the first surface FC1.

The first connection pad CPD1 of the first gate driver GDR1 may contact the second film FI1-2 of the first adhesive AD1.

The conductive balls BO of the first adhesive AD1 may be randomly arranged inside the first film FI1-1 so that the first pad PD1 and the first connection pad CPD1 may not electrically connected to each other.

In this state, a bonding device BD may bond the first gate driver GDR1 to the first substrate SUB1. In an embodiment, a tip of the bonding device BD may be disposed on a surface opposite to a surface OSF1 of the first flexible circuit board FPC1. The tip of the bonding device BD may overlap the first pads PD, the first conductive patterns PT1, and the first connection pads CPD1 in the first direction DR1.

The bonding device BD may apply heat while pressing the first flexible circuit board FPC1 in the first direction DR1. Thus, the first conductive film FI1 of the first adhesive AD1 may adhere to the first side surface SF1 and the first connection pad CPD1 of the first substrate SUB1 so that the first gate driver GDR1 is bonded to the first substrate SUB1.

Referring to FIGS. 10 and 11, the first pads PD1 may be electrically connected to the first gate driver GDR1. A shape of a first adhesive portion AD1' may be changed. In an embodiment, a boundary between a first film FI1-1 and a second film FI1-2 of a first conductive film FI' may be broken by heat and a pressure of the bonding device BD. One side of the first conductive film FI1' may adhere to the side surface of the first base substrate BS1 and the color filter CF, i.e., the first side surface SF1 of the first substrate SUB1.

The other side of the first conductive film FI'1 may adhere to the first connection pads CPD1 of the first gate driver GDR1.

The conductive balls BO may move within the first conductive film FI1' when the shape of a first adhesive portion AD1' is changed. The conductive balls BO disposed between the first conductive patterns PT1 and the first connection pads PD1 among the plurality of conductive balls BO may contact each other to electrically connect the first conductive patterns PT1 and the first connection pads PD1 to each other. The conductive balls BO disposed between the first side surface SF1 and a surface OSF1 of the first flexible circuit board FPC1 among the plurality of conductive balls BO may not contact each other. Thus, the adjacent first conductive patterns PT1 may be insulated from each other, and the adjacent first connection pads CPD1 may be insulated from each other.

As a result, each of the first pads PD1 may be electrically connected to the corresponding first gate driver GDR1 through the first conductive pattern PT1 of the first adhesive AD1' and the conductive balls BO aligned to contact each other between the first conductive patterns PT1 and the first connection pads PD1.

Although not shown, the structure in which the first pads PD1 disposed on the opposite side of the first substrate SUB1 are electrically connected to the second gate driver GDR2 may be the same as the structure in which the first pads PD1 are connected to the first gate driver GDR1. Therefore, any repetitive detailed description of the structure in which the first pads PD1 are connected to the second gate driver GDR2 will be omitted.

Figure 12:
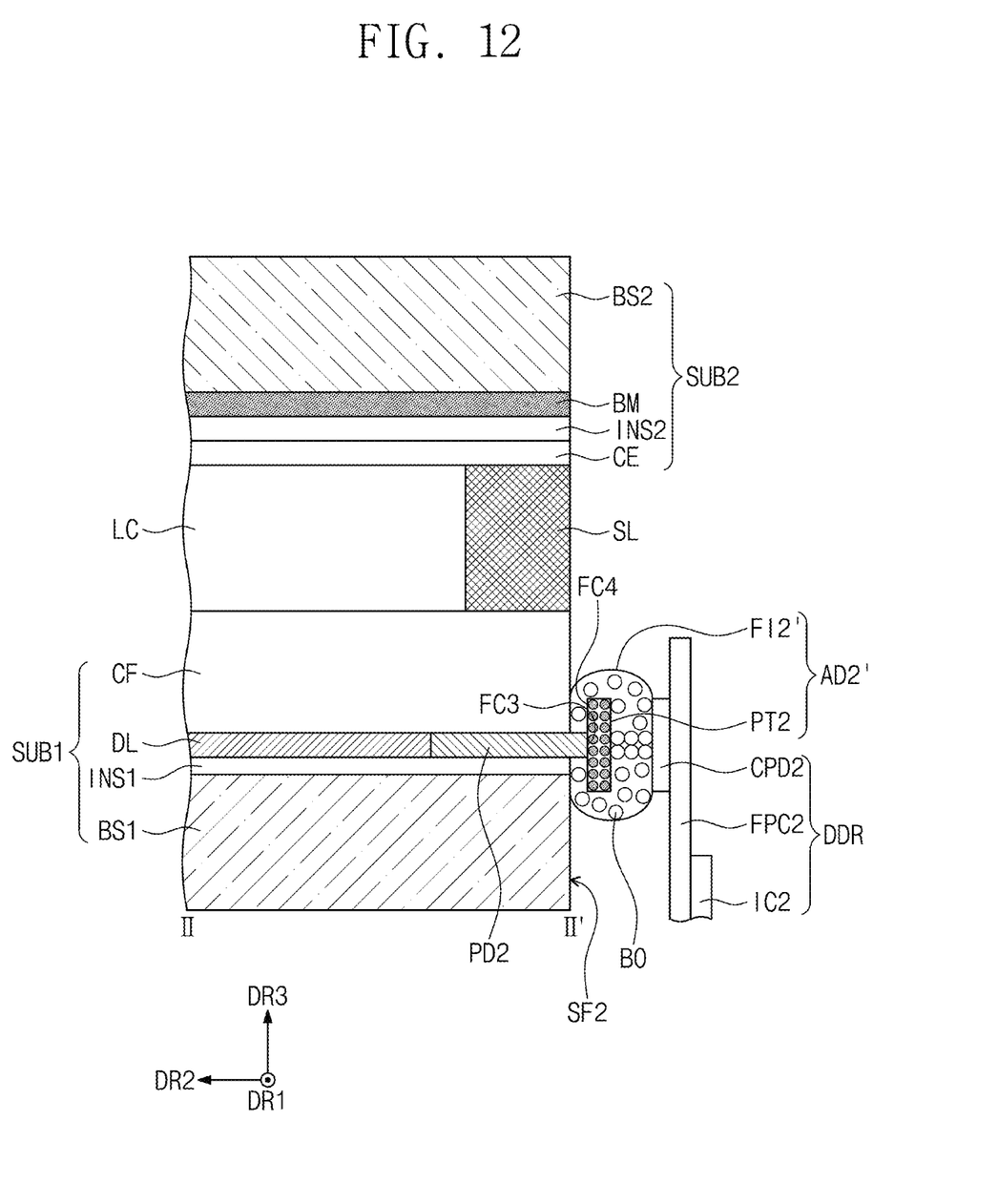
FIG. 12 is a cross-sectional view taken along line II-II' of FIG. 2.

FIG. 12 is a cross-sectional view taken along line II-II' of FIG. 2.

FIG. 12 illustrates a connection state between the second pads PD2 and the data driver DDR. The structure in which the second pads PD2 are connected to the data driver DDR may be similar to the above-described structure in which the first pads PD1 are connected to the first gate driver GDR1.

In an embodiment, the plurality of second pads PD2 may be electrically connected to the data lines DL. Each of the second pads PD2 may include a conductive material. The second pads PD2 may further protrude outward than the second side SF2 of the first substrate SUB1. In such an embodiment, the second pads PD2 may protrude from the second side SF2 of the first substrate SUB1 in the second direction DR2. Although not shown, the second pads PD2 may be spaced apart from each other in the first direction DR1.

The second flexible circuit board FPC2 of the data driver DDR may be disposed to face the second side SF2. The second flexible circuit board FPC2 may extend in the first direction DR1. The data driver DDR may include a plurality of second connection pads CPD2 disposed on a surface of the second flexible circuit board FPC2 facing the second side SF2. Each of the second connection pads CPD1 may include a conductive material.

The second connection pads CPD2 may overlap the second pads PD2 in the second direction DR2. The second driving chip IC2 may be disposed on the opposite surface of the second flexible circuit board FPC1.

A second adhesive AD2' may be disposed between the second pads PD2 and the data driver DDR. The second adhesive AD2' may have the same structure as the first adhesive AD1'. In an embodiment, the second adhesive AD2' may include a plurality of second conductive patterns PT2 and a second conductive film FI2'. The second conductive film FI2' may be an ACF. The second conductive film FI2' may extend in the first direction DR1. The second conductive film FI2' may include a plurality of conductive balls BO.

Before the data driver DDR is bonded to the second side surface SF2 of the first substrate SUB1, the second conductive film FI2' may have a structure in which a plurality of films are laminated, as described above with respect to the first conductive film FI1.

After the bonding process is performed, a side of the second conductive film FI2' may adhere to the side surface of the base substrate BS1 and the side surface (i.e., the second side surface SF2 of the first substrate SUB1) of the color filter CF. The other side of the conductive film FI2' may adhere to the second connection pad CPD2.

The second conductive patterns PT2 may include a plurality of conductive particles CO. In one embodiment, for example, the conductive particles CO may include silver (Ag).

The second conductive patterns PT2 may be spaced apart from each other in the first direction DR1 to correspond to the second pads PD2. Thus, the second conductive patterns PT2 may be electrically insulated from each other. Each of the second conductive patterns PT2 may overlap the corresponding second pads PD2 and second connection pads CPD2.

A third surface FC3 of the second pads PD2 may contact a fourth surface FC4 of the second conductive patterns PT2. When viewed in the second direction DR2, the fourth surface FC4 has a surface area larger than that of the third surface FC3. Therefore, a contact area between the second pad PD2 and the second conductive pattern PT2 may be the same as the surface area of the third surface FC3.

The conductive balls BO disposed between the second conductive patterns PT2 and the second connection pads PD2 among the plurality of conductive balls BO of the second adhesive AD2' may contact each other to electrically connect the second conductive patterns PT2 and the second connection pads PD2 to each other. The conductive balls BO disposed between the second side surface SF2 and a surface of the second flexible circuit board FPC2 among the plurality of conductive balls BO may not contact each other. Thus, the adjacent second conductive patterns PT2 may be insulated from each other, and the adjacent second connection pads CPD2 may be insulated from each other.

As a result, each of the second pads PD2 may be electrically connected to the corresponding data driver DDR through the second conductive pattern PT2 of the second adhesive AD2' and the conductive balls BO aligned to contact each other between the conductive patterns PT2 and the second connection pads CPD2.

According to an embodiment of the invention, as the gate drivers GDR1 and GDR2 and the data driver DDR are bonded to the side surface of the display panel DP, the bezel area of the display device DD may be reduced to provide a wider display screen to the user.

In such an embodiment, since the first pads PD1 and the second pads PD2, which are connected to the gate lines GL and the data lines DL protrude from the side surfaces SF1 and SF2 of the first substrate SUB1, the pads PD1 and PD2 and the conductive patterns PT1 and PT2 may be stably connected to each other.

In such an embodiment, since each of the surfaces FC2 and FC4 of the conductive patterns PT1 and PT2 has the surface area greater than that of each of the surfaces FC1 and FC3 of the pads PD1 and PD2, which respectively contact the surfaces FC2 and FC4, the predetermined contact area between the conductive pads PT1 and PT2 and the pads PD1 and PD2 may be secured.

In an embodiment of the invention, since the conductive patterns PT1 and PT2 including the highly conductive metal material are directly connected to the pads PD1 and PD2, the stable signal pad may be secured between the signal lines GL and DL and the driving units GDR1, GDR2, and DDR.

According to an embodiment of the invention, the first pads, the first conductive patterns disposed between the first pads and the first gate driver, and the first conductive film may be disposed between the gate lines and the first gate driver. The first pads may be electrically connected to the gate line to further protrude outward than the first side surface of the first substrate, and the first gate driver may be stably connected to the gate lines by the first conductive film and the first conductive pattern disposed between the first conductive film and the first pads to overlap the first pads.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a first substrate comprising a plurality of gate lines extending in a first direction, a plurality of data lines extending in a second direction crossing the first direction, and a plurality of pixels connected to the gate lines to the data lines;
    a second substrate disposed on the first substrate;
    an image display layer disposed between the first substrate and the second substrate;
    a plurality of first pads electrically connected to the gate lines, respectively, wherein a surface defining a terminal side edge of the first pads further protrude outward than a first side surface defining a terminal side edge of the first substrate in the first direction;
    a gate driver facing the first pads; and
    a first adhesive disposed between the gate driver and the first pads,
    wherein the first adhesive comprises:
    a first conductive film; and
    a plurality of first conductive patterns disposed between the first conductive film and the first pads to respectively overlap the first pads,
    wherein an entirety of the plurality of first pads and gate lines are defined in a same layer having a same thickness along an entire length defining the entirety of the plurality of first pads and gate lines connected thereto.

2. The display device of claim 1, wherein
    the first conductive film extends in the second direction, and
    the plurality of first conductive patterns are spaced apart from each other in the second direction.

3. The display device of claim 2, wherein the surface of each of the first pads faces a surface of a corresponding one of the first conductive patterns and contacts the surface of the corresponding one of the first conductive patterns.

4. The display device of claim 3, wherein the surface of the corresponding one of the first conductive patterns has a surface area greater than a surface area of the surface of each of the first pads.

5. The display device of claim 1, wherein the first conductive patterns are electrically insulated from each other.

6. The display device of claim 1, wherein the first conductive film comprises a plurality of conductive balls.

7. The display device of claim 6, wherein the gate driver comprises:
    a first flexible circuit board;
    a plurality of first connection pads disposed on a surface of the first flexible circuit board, which faces the first side surface, to overlap the first pads and the first conductive patterns; and
    a first driving chip mounted on the first flexible circuit board.

8. The display device of claim 7, wherein the conductive balls disposed between the first conductive patterns and the first connection pads among the plurality of conductive balls contact each other to electrically connect the first conductive patterns and the first connection pads to each other.

9. The display device of claim 1, further comprising:
    a plurality of second pads electrically connected to the data lines, respectively, wherein the second pads further protrude outward than a second side surface of the first substrate;
    a data driver facing the second pads; and
    a second adhesive disposed between the data driver and the second pads.

10. The display device of claim 9, wherein the second adhesive comprises;
    a second conductive film extending in the first direction; and
    a plurality of second conductive patterns disposed on the second conductive film and spaced apart from each other in the first direction,
    wherein each of the second conductive patterns overlaps the second pads.

11. The display device of claim 10, wherein a surface of each of the second pads faces a surface of a corresponding one of the second conductive patterns and contacts the surface of the corresponding one of the second conductive patterns.

12. The display device of claim 11, wherein the surface of the corresponding one of the second conductive patterns has a surface area greater than a surface area of the surface of each of the second pads.

13. The display device of claim 12, wherein the second conductive patterns are electrically insulated from each other.

14. The display device of claim 10, wherein the second conductive film comprises a plurality of conductive balls therein.

15. The display device of claim 10, wherein the data driver comprises:
    a second flexible circuit board;
    a plurality of second connection pads disposed on a surface of the second flexible circuit board, which faces the second side surface, to overlap the second pads and the second conductive patterns; and
    a second driving chip mounted on the second flexible circuit board.

16. The display device of claim 1, wherein each of the first conductive patterns comprises silver (Ag).

17. The display device of claim 1, further comprising:
a color filter disposed between the first substrate and the image display layer,
wherein the first adhesive is attached to the first side surface of the first substrate and a side surface of the color filter.

* * * * *